US012608090B1

(12) United States Patent
    Soulkine

(10) Patent No.: US 12,608,090 B1
(45) Date of Patent: Apr. 21, 2026

(54) CHORDED MULTILINGUAL HUMAN INTERFACE CONTROLLER CHORDABC

(71) Applicant: Grigori Soulkine, Vaughan (CA)

(72) Inventor: Grigori Soulkine, Vaughan (CA)

( * ) Notice: Subject to any disclaimer, the term of this patent is extended or adjusted under 35 U.S.C. 154(b) by 0 days.

(21) Appl. No.: 19/313,810

(22) Filed: Aug. 28, 2025

(51) Int. Cl.
    *G06F 3/023* (2006.01)
    *G06F 3/04886* (2022.01)
    *H03M 11/08* (2006.01)

(52) U.S. Cl.
    CPC ........ *G06F 3/0235* (2013.01); *G06F 3/04886* (2013.01); *H03M 11/08* (2013.01)

(58) Field of Classification Search
    CPC ............................. G06F 3/0235; H03M 11/08
    See application file for complete search history.

(56) References Cited

U.S. PATENT DOCUMENTS

| | | | | |
|---|---|---|---|---|
| 6,232,892 B1 * | 5/2001 | Burrell, IV | ......... | H04M 1/2748 |
| | | | | 341/21 |
| 6,232,956 B1 * | 5/2001 | Mailman | .................. | G06F 3/038 |
| | | | | 345/171 |
| 6,323,846 B1 * | 11/2001 | Westerman | ........... | G06F 3/0235 |
| | | | | 345/173 |
| 6,542,091 B1 * | 4/2003 | Rasanen | ............... | G06F 3/0219 |
| | | | | 400/489 |
| 6,625,283 B1 * | 9/2003 | Sato | ...................... | G06F 3/0235 |
| | | | | 379/433.06 |

| | | | | |
|---|---|---|---|---|
| 8,368,563 B2 * | 2/2013 | Martin | ................. | H01H 13/705 |
| | | | | 345/169 |
| 9,891,821 B2 * | 2/2018 | Luo | ........................ | G06F 3/0216 |
| 11,249,558 B1 * | 2/2022 | Garlock | ................ | G06F 3/0235 |
| 2010/0109915 A1 * | 5/2010 | Scarboro | ................ | H03M 11/18 |
| | | | | 341/20 |
| 2010/0289738 A1 * | 11/2010 | Schoonover | .......... | G06F 3/0236 |
| | | | | 345/156 |
| 2010/0328227 A1 * | 12/2010 | Matejka | ................ | G06F 3/0488 |
| | | | | 345/173 |
| 2011/0035696 A1 * | 2/2011 | Elazari | ................... | G06F 3/0237 |
| | | | | 715/773 |
| 2012/0293417 A1 * | 11/2012 | Dennis | ................. | G06F 3/0233 |
| | | | | 345/168 |
| 2013/0194190 A1 * | 8/2013 | Lysenko | ............... | G06F 3/0234 |
| | | | | 345/169 |
| 2014/0267058 A1 * | 9/2014 | Svensson | .............. | G06F 3/0219 |
| | | | | 345/169 |

(Continued)

*Primary Examiner* — Patrick F Marinelli

(57) ABSTRACT

This invention is a chording keyboard, with air mouse and IR TV remote blindly operated by two hands. Leading hand is pressing buttons on the front of the device to enter General chord and another holding hand is pressing buttons on the side of the device to enter Modifier chord where one modifier button—#6 is activating air mouse. Changing Modifier chord allows to switch General chord from input of characters to input of numbers, punctuation, brackets, edit and TV commands, etc. Device operating system allows to manage languages, shortcuts, data strings and etc. by pressing predefined Modifier and General chords pairs. Simplified chording sequence is introduced to associate it order with any alphabetic languages characters order, numbers order, punctuation, brackets, edit commands and etc. It allows to increase input speed, improves convenience and significantly helps to learn and remember associated chords pairs.

6 Claims, 7 Drawing Sheets

(56) References Cited

U.S. PATENT DOCUMENTS

| | | | |
|---|---|---|---|
| 2014/0340313 A1* | 11/2014 | Dennis | G06F 40/274 |
| | | | 345/168 |
| 2017/0031459 A1* | 2/2017 | Dennis | G06F 40/274 |
| 2020/0393914 A1* | 12/2020 | Keen | G06F 3/0235 |

* cited by examiner

FIG. 1
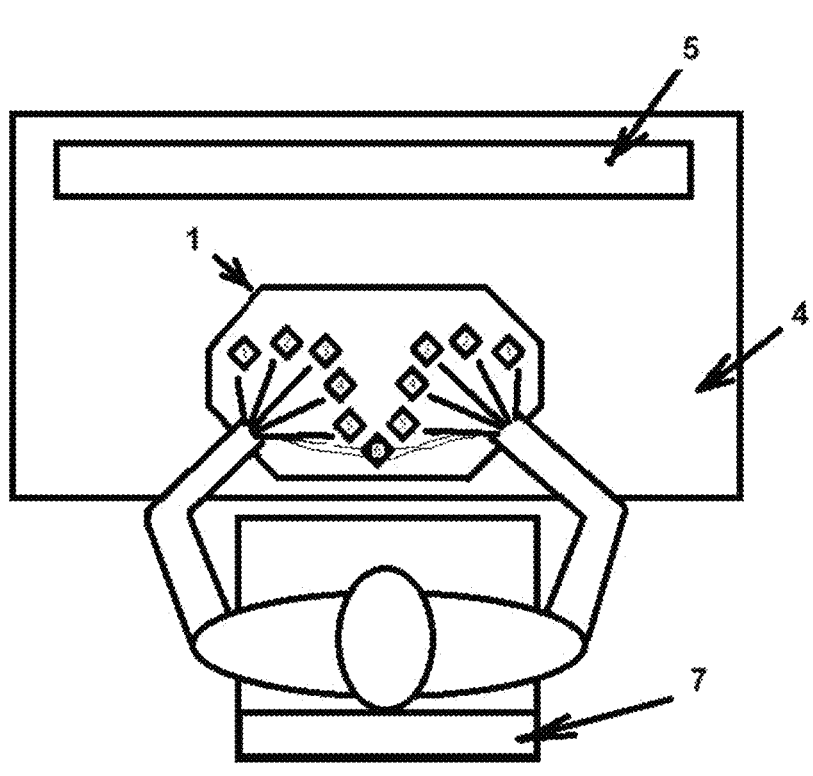
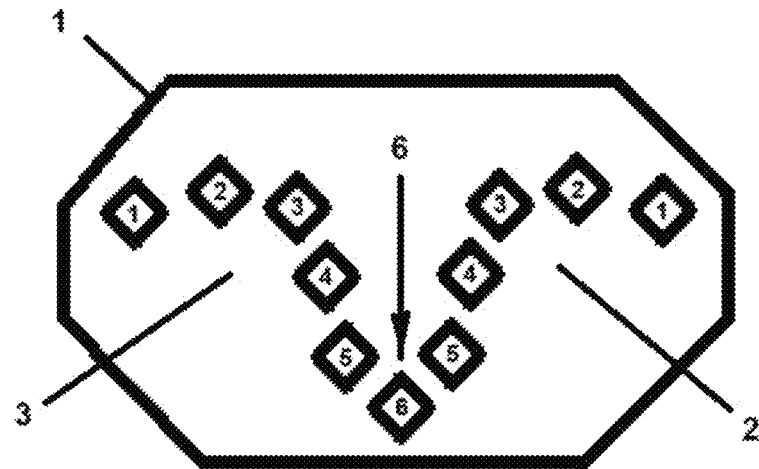

FIG. 2
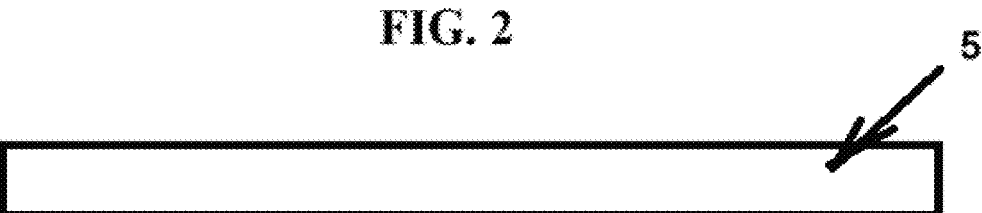
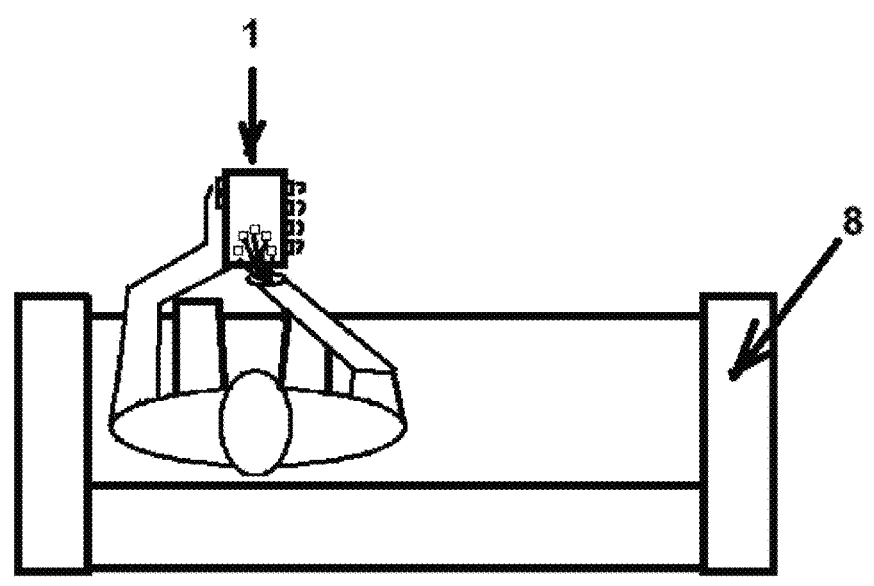
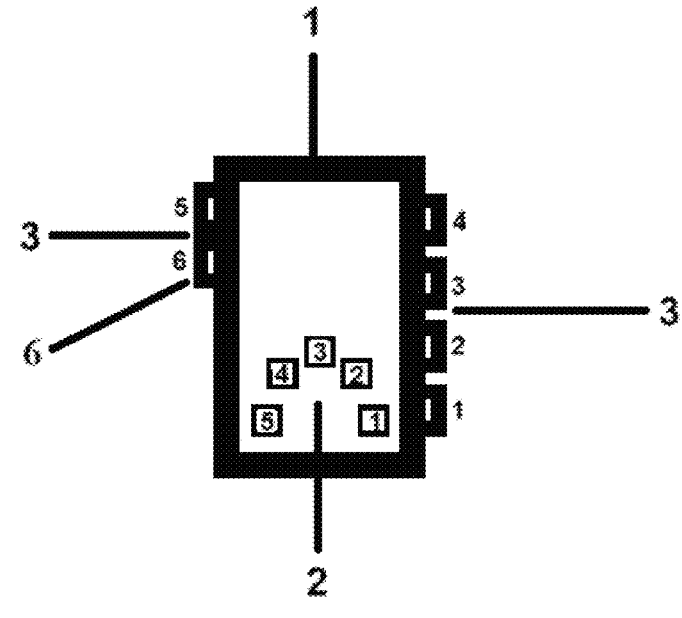

FIG. 3
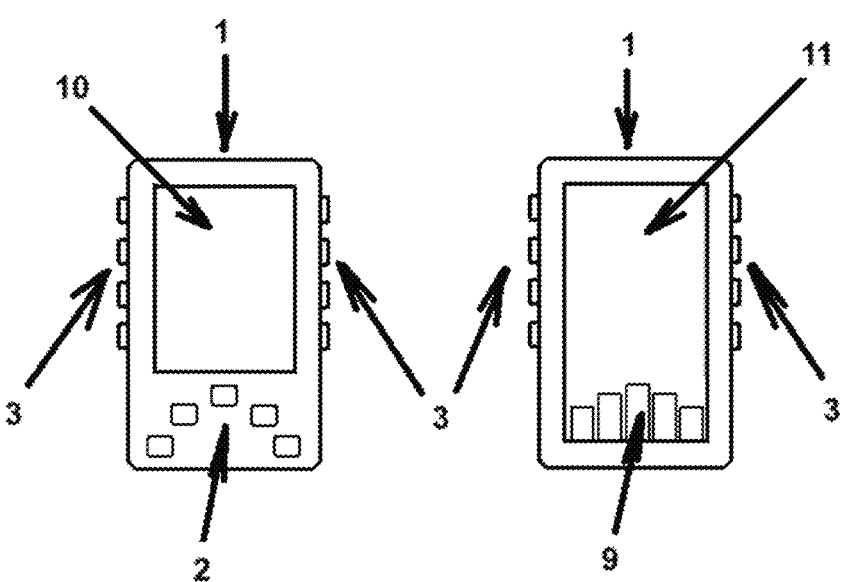

FIG. 5

| # | Label | 1 | 2 | 3 | 4 | 5 |
|---|-------|---|---|---|---|---|
| 1 | LETTERs | | | | | |
| 2 | MORE LETTERs | | ● | | | |
| 3 | CAP LETTERs | | | ● | | |
| 4 | MORE CAP LETTERs | | ● | ● | | |
| 5 | ACSENTs | | | ● | ● | |
| 6 | OPERATIONs | | ● | | ● | |
| 7 | PUNCTUATIONs | | | | ● | |
| 8 | NUMBERs | | | | | ● |
| 9 | BRACKETs | | ● | | | ● |
| 10 | EDIT OPERATIONs | | | ● | | ● |
| 11 | ALT COMMAND | ● | | | | ● |
| 12 | SHORTCUT | ● | ● | | | |
| 13 | SET LANG | ● | | ● | | |
| 14 | PRINT DATA | ● | | | ● | |
| 15 | F1-F12 | | | | ● | ● |
| 16 | F13-24 | | | ● | ● | ● |
| 17 | MEDIA1 COMMANDs | ● | | | | |
| 18 | MEDIA2 COMMANDs | ● | ● | | ● | |
| 19 | TV1 COMMANDs | | ● | ● | ● | |
| 20 | TV2 COMMANDs | | ● | | ● | ● |
| 21 | TV3 COMMANDs | | ● | ● | ● | ● |
| 22 | ADD SHORTCUT | ● | ● | ● | | |
| 23 | ADD LANG | ● | | ● | ● | |
| 24 | ADD DATA | ● | | | ● | ● |
| 25 | PRINT SHORTCUTs | ● | | ● | | ● |
| 26 | PRINT LANGs | ● | ● | | | ● |
| 27 | CUSTOMIZE | ● | ● | ● | ● | |

2 —— M

CHORDED MULTILINGUAL HUMAN INTERFACE CONTROLLER CHORDABC

PRIOR ART

The present invention mostly relates to a chording input device and method of entering keyboard characters and command, mouse and TV remote commands that will be send to Smart TV or to PC connected to display (TV). This device operated by chords can be handheld, can be incorporated into smart phone or can be operated stationary without TV remote. It is mostly related to Classification—G06F3/0235—Character input methods using chord techniques and H03M11/08—Coding in connection with keyboards or like devices, by operating selected combinations of multifunction keys. Most chording devices are one hand operated with effort made to maximize typing efficiency. There are two hands operated devices, for example, in US20170031459A1—Typing Input Systems, Methods, and Devices 2 hands stationary device have no multilingual mapping, both hand sets buttons are equally functioned; in US20100109915A1—Rapid Typing System for a Hand-held Electronic Device 2 hands hand-held device with trackball where both hand sets are equally functioned too, so to switch mapping to different item groups there are supplementary thumb-aligned input buttons. Device have no multilingual mapping too.

BACKGROUND OF THE INVENTION

Technical Problem

A chorded keyboard with a limited number of keys has been developed as an alternative to the full size keyboard. The keys, that are simultaneously activated and referred to as a "chord", are related to one keyboard character, symbol or command. Essential problem for a chorded keyboard is a necessity to learn and memorize this relation. That is the main problem preventing wide use of chorded keyboards. Also, because of the necessity to simultaneously operate mouse, many chorded keyboards where developed as one handed. Furthermore, in case of sitting far away in front of large display connected to Personal Computer or smart TV, there is a problem with placing and accessing regular keyboard, regular mouse and regular TV remote, also another full size keyboard is required for the second language use.

Solution to Problem

Present invention of chorded controller combine the follow 6 improvements together:
1. It incorporates air mouse and TV remote to allow two hands operations. Due to this and to
2. Introduction of new Simplified chording sequence used for mapping, learning and remembering chords relation to character, symbol or command was simplified. This Simplified chording sequence begins with 15 chords with only one or two buttons pressed and is used for basic operations.
3. Also, all buttons were combined into 2 sets of 5-6 buttons, where the General chord set is operated by leading hand. Another, Modifier chords set, is operated by another hand and is used only to modify mapping relation for General chord set. Furthermore 4. Simplified chording sequence for General chords are mapped to the alphabet characters and numbers by there order, so it can be used for any language with alphabet.
5. To facilitate the use of the first half of Simplified sequence 15 chords for Modifier chords too, all related keyboard characters, symbols or commands are grouped by 15 items or less into 15 groups, were each group is associated with one Modifier chord. General chords for related items in the group are also serialized or mnemonically arranged.
6. All languages having alphabet have been divided into 2 groups-one with capital letters and with alphabet of size 30 or less-like English and another without capital letters and with alphabet of size of 60 or less-like Hindi. This division allows to place all characters for any language in first 4 items groups.

This controller is using modern technologies: Bluetooth—for wireless connection to PC and MEMS (accelerometer and gyroscope) motion sensors—for air mouse to simplify device implementation.

Advantageous Effects of Invention

This device allows entering first 9 and another 9 English alphabet characters and 9 digit almost right away and significantly simplify learning and remembering other alphabet characters. To remember the character code it is possible to spell alphabet while chording Simplified sequence. Same is true for other languages after new language setup. Device is operated as unified keyboard, mouse and TV remote. It also can control other home devices and can be incorporated into smart phone. For smart TVs fully controlled by keyboard there will be no need for IR TV remote. Stationary controller implemented without TV remote can be used as educational toy.

SUMMARY OF THE INVENTION

An object of the present invention is to simplify as much as possible learning and remembering chords relation to the multilingual characters, symbols or commands. This goal is achieved by incorporating air mouse into device for 2 hand operations, combining buttons into General set of 5 buttons operated by the leading hand and Modifier set of 6 buttons operated by another hand and also by introducing Simplified chording sequence for both General and Modifier chords. Each Modifier chord in this sequence is assign to the General group of related keyboard characters, symbols or commands having 15 items or less. Related items in this Leading group are also serialized or mnemonically arranged. Additional data processing functionality was beneficially implemented by Chorded controller Device Operating System.

BRIEF DESCRIPTION OF DRAWINGS

Additional Having thus described the invention in general terms, reference will now be made to the accompanying drawings, which are not necessarily drawn to scale, and wherein:

FIG. 1 illustrates chorded stationary controller embodiment according to claim 1.

FIG. 2 illustrates right handed chorded remote handheld controller embodiment according to claim 2.

FIG. 3 illustrates chorded remote handheld controller incorporated into smart phone according to claim 4 and language menu on PC.

FIG. 5 Simplified Modifier chording sequence for different chording groups

Figure 4:
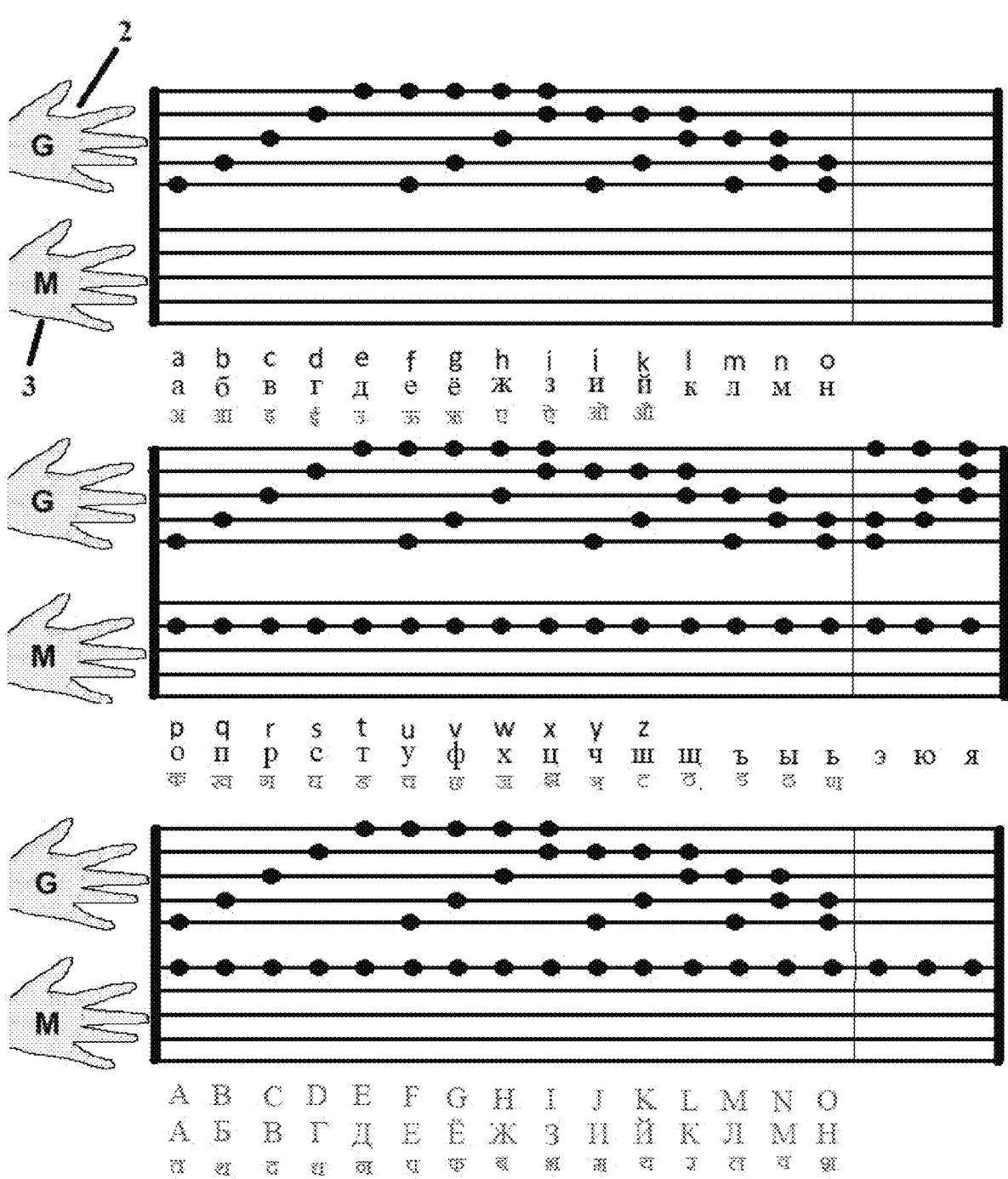
FIG. 4 Simplified General chording sequence for different languages.

Elements numbers throughout all drawings:

1—controller; 2—General chord buttons set; 3—Modifier chord buttons set; 4—table; 5—display; 6—Last modifier chord button for mouse activation; 7—chair; 8—sofa; 9—General chord buttons are implemented as 5 Touch Target Areas; 10—screen; 11—touch screen; 12—Language menu on PC; 13—IR transmitter for TV remote; 14—IR sensor to read existing TV remote command; 15—Gyroscope and accelerometer MEMS sensors for air mouse; 16—Non volatile memory.

DETAILED DESCRIPTION OF THE INVENTION

The present inventions now will be described more fully hereinafter with reference to the accompanying drawings, in which some examples of the embodiments of the inventions are shown. Indeed, these inventions may be embodied in many different forms and should not be construed as limited to the embodiments set forth herein; rather, these embodiments are provided by way of example so that this disclosure will satisfy applicable legal requirements. Like numbers refer to like elements throughout.

First embodiment is presented on FIG. 1. It shows stationary controller placed on the same table as PC display in front of it and connected to Personal Computer—PC, wirelessly or by USB cable. General 2 and modifier 3 buttons sets are symmetrically located. Modifier chord set last button #6 for mouse activation 6 is located in the middle and can be activated by any hand. This allow switching right hand operations to left and back by predefined chords pair command. In this configuration TV remote is not implemented. Here for air mouse accelerometer MEMS sensor 15 is used inside of the device. Device movement forward, back, left or right cause corresponding cursor movement on display if button #6 is pressed. Mouse buttons are also associated with some general 2 and modifier 3 set buttons. This device can be used as educational toy before operating following, more complex remote handheld controller. Second embodiment is presented on FIG. 2. It shows right handed remote handheld controller in hands of person sitting on a sofa in front of large TV connected to PC. General chord 2 buttons are located on the device front and modifier chord 3 buttons are located on the sides. This device incorporates IR transmitter for TV remote 13 and IR sensor 14 to read and store existing TV remote commands. For air mouse gyroscope MEMS sensors 15 are used inside of the device. Device turning in 3 axis are producing corresponding cursor movement in different directions and scrolling on the display, if mouse is activated by button #6 6 with thumb. Mouse buttons are associated to some General 2 and Modifier 3 set buttons. Thumb should activate only button #5 or #6. In a future, when Smart TV will accept Bluetooth commands, IR TV remote may be not required.

Third embodiment is presented on FIG. 3. It shows remote handheld controller incorporated into smart phone. It has the same General and Modifier chord set buttons as controller on FIG. 2 or General chords buttons 2 are implemented as five Touch Target Areas 7 on the bottom of the touch screen 11.

Each item-characters, symbols or commands in any items group is associated with General and Modifier chords pair. Input event, monitored by controller Device Operated System (DOS), starts when any of the General chord set buttons is pressed and ends, when all General chord buttons are released. During this event all pressed General and Modifier chord sets buttons are recorded by DOS and resulted in chords pair. The input of the chain of events, like entering ALT symbol numbers, can be terminated by release of the Modifier chord set buttons for this operation.

To simplify chords relation to the multilingual characters, symbols or commands Simplified chording sequence is introduced, see FIG. 4. It begins with 15 chords of the total 31 available for 5 keys combinations for General chords where at least one key should be pressed and 32—for Modifier chords and consist of non, one or two key combinations—this is Basic sequence that will be mostly used for General and Modifier chords. The rest of the sequence—Extended sequence—will be used for special cases.

All keyboard characters, symbols or commands are grouped by 15 items or less into 15 groups, where each group is associated with one Modifier chord also from Basic sequence, see FIG. 5. For setup commands Extended sequence is mostly used.

All languages having alphabet have been divided into 2 groups—one with capital letters and with alphabet of size 30 or less—like English and another without capital letters and with alphabet of size of 60 or less—like Hindi. This division allows to place all characters for any language in first 4 items groups. To accommodate special rules and symbols for some languages—5. ACSENTs group was introduced. For languages with alphabet size larger then 30 or 60 chars-like Russian or Khmer—part of Extended sequence will be used for group with more then 15 items as exception.

The follow additional operations are performed by controller DOS in response to activating predefined General and Modifier chord pair:

1. Entering ALT symbol,
2. Set list of the languages to be used,
3. Set current language, that include shortcut to change Language menu 12 on display on FIG. 3.
4. Set and send shortcuts command
5. Set and print data string-account number, passwords and etc. that include ALT symbols
6. Change the leading hand from right to left and back
7. Read and set TV remote button code
8. Print list of available languages
9. Print list of selected languages
10. Print preset shortcuts
11. Print preset data strings
12. Print DOS system version
13. Print battery level.

Figure 6:
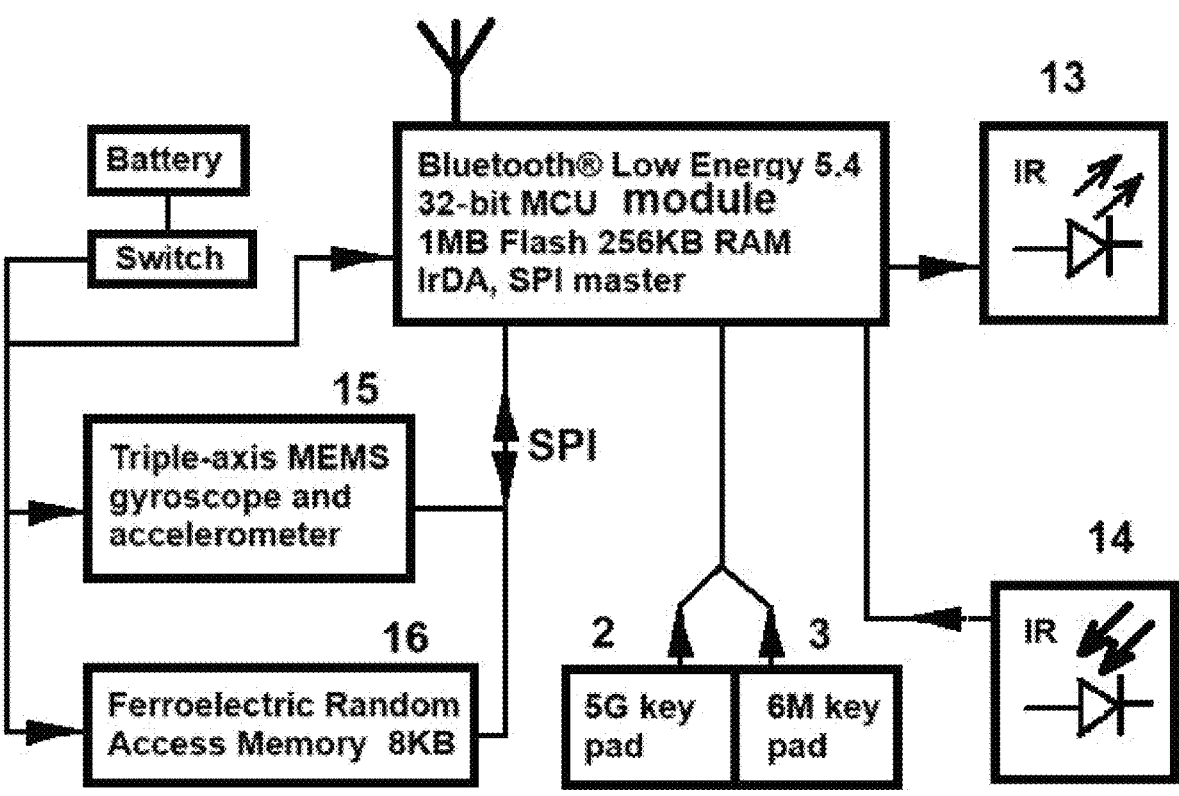
FIG. 6 Controller hardware diagram
Figure 7:
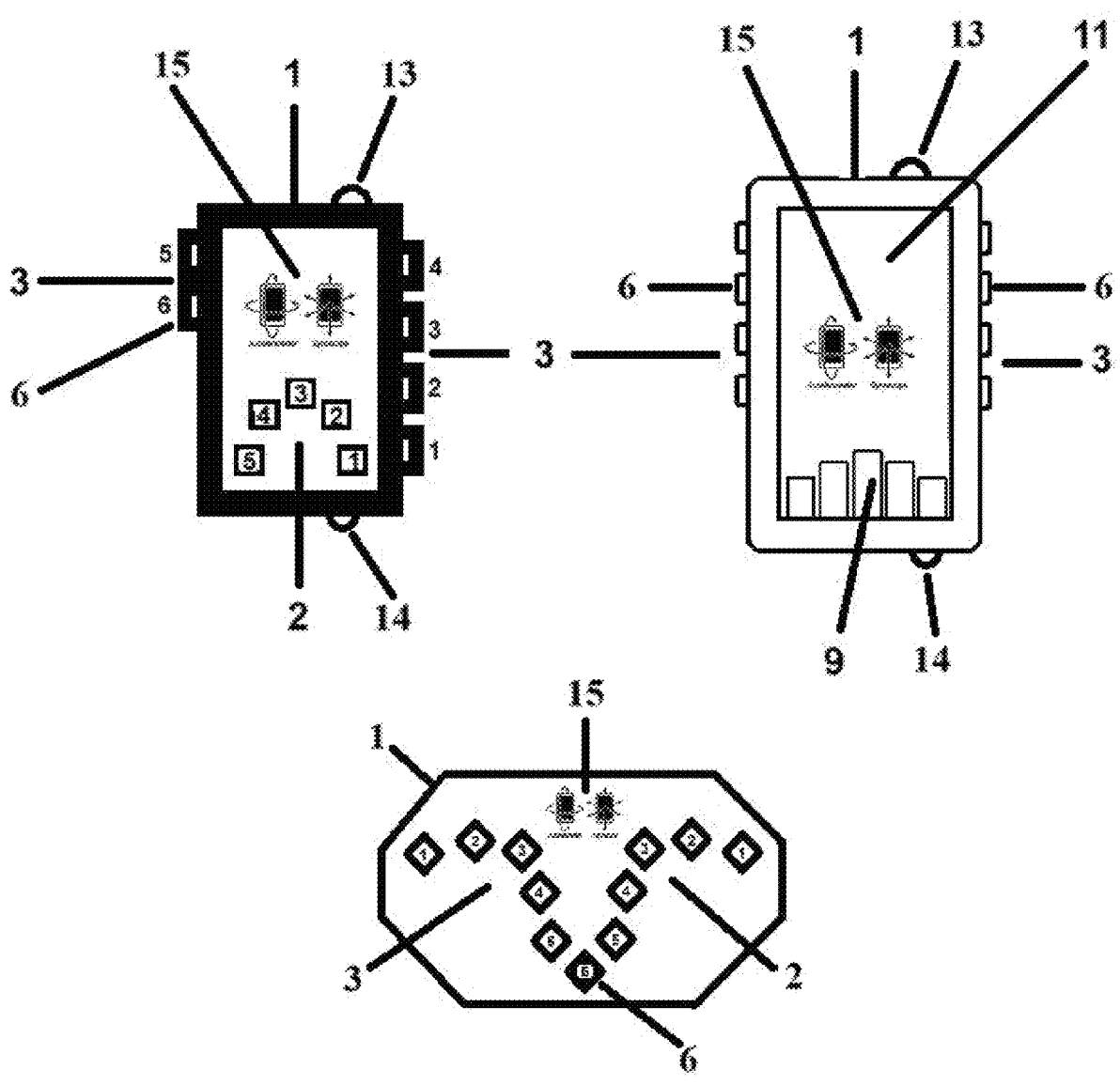
FIG. 7 Front page view

The DOS is implemented based on Bluetooth module for HID USB connection to PC with onboard MEMS motion sensor for air mouse and non-volatile memory chip to store customized data—see FIG. 6.

The invention claimed is:

1. A chording input device comprising:

a controller;

at least one MEMS sensor;

a first set of chord buttons for a first hand of a user;

a second set of chord buttons for a second hand of a user; and at least one last chord button, wherein the at least one last chord button and a chord button of the second set of chord buttons are activated by the thumb of the second hand of the user, wherein an input event begins when any of the first set of chord buttons are activated, wherein the input event ends when all of the first of chord buttons are released or all of a second set of chord buttons are released, wherein, during the input event, all of the activated chord buttons, from the first set of chord buttons and the second set of chord buttons, are recorded and results in a chord pair, wherein an item is entered based on the chord pair, wherein the last second chord button activated by the thumb is for mouse activation, which causes mouse buttons to be associated to some of the first set of chord buttons and some of the second set of chord buttons, wherein the first set of chord buttons are general chords, wherein the second set of chord buttons are modifier chords, wherein, based on the activated second set of chord buttons, the item that is entered includes a character, number, symbol, and a command, and wherein the chording input device connects to a computer via a cable or wirelessly.

2. The chording input device of claim 1, wherein an operation is performed based on the chord pair, including:

entering an ALT symbol, setting list of languages to be used, setting current language, setting and sending shortcut commands, setting and printing data string, changing the first set of chord buttons to be modifier chords and the second set of chord buttons to be general chords, reading and setting TV remote button codes, printing list of available languages, printing list of selected languages, printing preset shortcuts, printing preset data strings, printing system version, and printing battery level.

3. The chording input device of claim 1, wherein the character is a multilingual character, and wherein all characters, numbers, symbols, and commands are grouped into 15 items or less, where there are 15 groups and each group is associated with at least one modifier chord, wherein all items in a group are associated with list of chords with only 1 or 2 chord buttons that are general chords.

4. The chording input device of claim 1, further includes:

a IR transmitter;

a IR sensor;

wherein the second set of chord buttons are located on the sides of the chording input device and are accessible when grasped by one of the user's hands, wherein, based on the activated second set of chord buttons, the item that is entered includes a TV command, wherein an operation is performed based on the chord pair, including:

reading and setting TV remote button codes.

5. The chording input device of claim 1, further includes:

a touch screen, wherein the first set of chord buttons are implemented as five touch target areas at the bottom of the touch screen, wherein the second set of chord buttons are physical buttons, with buttons arranged on the sides of the chording input device.

6. The chording input device of claim 1, wherein the character is a multilingual character, wherein all characters, numbers, symbols, and commands are grouped into 18 items or less, wherein all items in a group are associated with list of chords with up to three chord buttons that are general chords.

* * * * *